(12) United States Patent
Kawabata et al.

(10) Patent No.: US 10,269,726 B2
(45) Date of Patent: Apr. 23, 2019

(54) ELECTRONIC CIRCUIT PACKAGE

(71) Applicant: TDK Corporation, Tokyo (JP)

(72) Inventors: Kenichi Kawabata, Tokyo (JP); Toshio Hayakawa, Tokyo (JP); Toshiro Okubo, Tokyo (JP)

(73) Assignee: TDK CORPORATION, Tokyo (JP)

( * ) Notice: Subject to any disclaimer, the term of this patent is extended or adjusted under 35 U.S.C. 154(b) by 10 days.

(21) Appl. No.: 15/641,568

(22) Filed: Jul. 5, 2017

(65) Prior Publication Data

US 2018/0033738 A1 Feb. 1, 2018

(30) Foreign Application Priority Data

Jul. 26, 2016 (JP) .................................. 2016-145891

(51) Int. Cl.
*H01L 23/552* (2006.01)
*H01L 21/3205* (2006.01)
(Continued)

(52) U.S. Cl.
CPC ...... *H01L 23/552* (2013.01); *H01L 21/32051* (2013.01); *H01L 21/561* (2013.01); *H01L 23/315* (2013.01); *H01L 23/3121* (2013.01); *H01L 23/49822* (2013.01); *H01L 23/49838* (2013.01); *H01L 24/16* (2013.01); *H01L 24/97* (2013.01); *H01L 25/16* (2013.01); *H01L 24/13* (2013.01); *H01L 2224/131* (2013.01); *H01L 2224/16227* (2013.01); *H01L 2224/97* (2013.01); *H01L 2924/15192* (2013.01); *H01L 2924/15313* (2013.01); *H01L 2924/1815* (2013.01); *H01L 2924/19041* (2013.01); *H01L 2924/19042* (2013.01); *H01L 2924/19105* (2013.01); *H01L 2924/3025* (2013.01)

(58) Field of Classification Search
CPC ............... H01L 2224/131; H01L 24/13; H01L 2924/19042; H01L 2924/19041; H01L 2924/1815; H01L 2924/15313; H01L 2924/15192; H01L 2224/97
See application file for complete search history.

(56) References Cited

U.S. PATENT DOCUMENTS

2011/0304015 A1 12/2011 Kim et al.
2013/0214396 A1* 8/2013 Kim ...................... H01L 23/552
257/659
(Continued)

FOREIGN PATENT DOCUMENTS

JP 02-220496 A 9/1990
JP 05-235582 A 9/1993
(Continued)

*Primary Examiner* — Marc Anthony Armand
*Assistant Examiner* — Sue Tang
(74) *Attorney, Agent, or Firm* — Young Law Firm, P.C.

(57) ABSTRACT

Disclosed herein is an electronic circuit package includes a substrate having a power supply pattern, a first electronic component mounted on a first region of a front surface of the substrate, a mold resin that covers the front surface of the substrate so as to embed the first electronic component therein, and a laminated film covering an upper surface of the mold resin, the laminated film including a magnetic film and a first metal film. The first metal film is connected to the power supply pattern. The magnetic film is selectively thick on the first region.

16 Claims, 22 Drawing Sheets

(51) Int. Cl.
*H01L 21/56* (2006.01)
*H01L 23/31* (2006.01)
*H01L 23/498* (2006.01)
*H01L 23/00* (2006.01)
*H01L 25/16* (2006.01)

(56) References Cited

U.S. PATENT DOCUMENTS

| 2015/0016066 | A1* | 1/2015 | Shimamura | H01L 23/3121 |
| | | | | 361/728 |
| 2015/0255401 | A1* | 9/2015 | Yanagida | H01L 23/552 |
| | | | | 257/659 |
| 2016/0358862 | A1* | 12/2016 | Lee | H01L 23/552 |

FOREIGN PATENT DOCUMENTS

| JP | 2008258478 A | 10/2008 |
| JP | 2009218484 A | 9/2009 |
| JP | 2010-087058 A | 4/2010 |
| JP | 2010206182 A | 9/2010 |
| JP | 2015035579 A | 2/2015 |

\* cited by examiner

ELECTRONIC CIRCUIT PACKAGE

BACKGROUND OF THE INVENTION

Field of the Invention

The present invention relates to an electronic circuit package and, more particularly, to an electronic circuit package provided with a composite shielding function having both an electromagnetic shielding function and a magnetic shielding function.

Description of Related Art

In recent years, an electronic device such as a smartphone is equipped with a high-performance radio communication circuit and a high-performance digital chip, and an operating frequency of a semiconductor IC used therein tends to increase. Further, adoption of an SIP (System-In Package) having a 2.5D or 3D structure, in which a plurality of semiconductor ICs are connected by a shortest wiring, is accelerated, and modularization of a power supply system is expected to accelerate. Further, an electronic circuit module having a large number of modulated electronic components (collective term of components, such as passive components (an inductor, a capacitor, a resistor, a filter, etc.), active components (a transistor, a diode, etc.), integrated circuit components (an semiconductor IC, etc.) and other components required for electronic circuit configuration) is expected to become more and more popular, and an electronic circuit package which is a collective term for the above SIP, electronic circuit module, and the like tends to be mounted in high density along with sophistication, miniaturization, and thinning of an electronic device such as a smartphone. However, this tendency poses a problem of malfunction and radio disturbance due to noise. The problem of malfunction and radio disturbance is difficult to be solved by conventional noise countermeasure techniques. Thus, recently, self-shielding of the electronic circuit package has become accelerated, and an electromagnetic shielding using a conductive paste or a plating or sputtering method has been proposed and put into practical use, and higher shielding characteristics are required in the future.

In order to realize the higher shielding characteristics, a composite shielding structure is proposed in recent years. The composite shielding structure has both an electromagnetic shielding function and a magnetic shielding function. In order to realize the composite shielding structure, it is necessary to form, in an electronic circuit package, an electromagnetic shielding by a conductive film (metal film) and a magnetic shielding by a magnetic film.

For example, the semiconductor package described in U.S. Patent Publication No. 2011/0304015 has a configuration in which a shield case (shield can) obtained by laminating a magnetic layer and a metal layer is bonded to a mold resin by adhesive. The semiconductor package described in U.S. Patent Publication No. 2013/0307128 has a configuration in which the surface of a mold resin is covered with a metal shield and a concave portion is formed in the mold resin so as to expose the upper surface of a semiconductor chip therethrough and then filled with a metal material or the like.

However, the configuration described in U.S. Patent Publication No. 2011/0304015 where an adhesive is used to bond the shield case is not only disadvantageous in terms of height reduction, but also makes it harder for the metal film to be connected to a ground pattern on a substrate. Further, the configuration described in U.S. Patent Publication No. 2013/0307128 where the concave portion formed in the mold resin is filled with a metal material or the like can enhance heat radiation performance; however, since it does not have a composite shield structure, shielding characteristics, especially in a low frequency region, are insufficient.

SUMMARY

The object of the present invention is therefore to provide an electronic circuit package capable of achieving both high composite shielding effect and height reduction.

An electronic circuit package according to the present invention includes a substrate having a power supply pattern; a first electronic component mounted on a first region of a front surface of the substrate; a mold resin that covers the front surface of the substrate so as to embed the first electronic component therein; and a laminated film covering at least an upper surface of the mold resin, the laminated film including a magnetic film and a first metal film, wherein the first metal film is connected to the power supply pattern, and wherein the magnetic film is selectively thick on the first region.

According to the present invention, a laminated film of the magnetic film and metal film is formed on at least the upper surface of the mold resin, so that high composite shielding characteristics can be obtained. In addition, a film thickness of the magnetic film above the first region is large, whereby magnetic shielding characteristics to the first electronic component can be enhanced. That is, in an electronic circuit package, not all the electronic components mounted on the substrate are noise sources of the same level, but only some specific electronic components may be particularly strong noise sources. Further, not all the electronic components mounted on the substrate are equally susceptible to external noise, but only some specific electronic components may be particularly susceptible to external noise. In the present invention, a film thickness of the magnetic film is selectively enlarged above the electronic component for which noise countermeasures are particularly required, whereby it is possible to suppress peak noise generated around the electronic component and to prevent malfunction of the electronic component susceptible to external noise. Further, a film thickness of the magnetic film is selectively enlarged above the first electronic component, enabling height reduction to be achieved in the case where the first electronic component is smaller in height than other electronic component. In addition, many magnetic materials have a higher thermal conductivity than the mold resin, so that radiation performance can be enhanced.

In the present invention, it is preferable that the upper surface of the mold resin has a concave portion on the first region, and a part of the magnetic film is formed in the concave portion. With this configuration, an upper surface of the magnetic film can be flat.

In the present invention, the magnetic film may be positioned between the first metal film and the mold resin. Alternatively, the first metal film may be positioned between the mold resin and the magnetic film in the concave portion. According to the former, noise radiated from the first electronic component can effectively be shielded and, according to the latter, external noise to be incident on the first electronic component can effectively be shielded. Further, by providing a second metal film that covers the magnetic film, the above both effects can be obtained.

The electronic circuit package according to the present invention further preferably includes a second electronic component mounted in a second region on the front surface of the substrate, and the first electronic component is preferably lower in height than the second electronic component. With this configuration, the concave portion is formed by exploiting the difference in height between the first and second electronic components, it is possible to suppress an increase in the height of the entire electronic circuit package in minimum that may be caused due to the formation of the magnetic film.

In the present invention, the upper surface of the first electronic component is preferably exposed to the concave portion, and hence, the upper surface of the first electronic component preferably contacts the magnetic film or the first metal film. With this configuration, the thickness of the magnetic film can be made larger, thereby making it possible to enhance magnetic shielding characteristics. In addition, since the upper surface of the first electronic component contacts the magnetic film or the first metal film, high radiation performance can be obtained.

In the present invention, the planar size of the concave portion is preferably larger than that of the first electronic component, and hence, the concave portion preferably overlaps the entire first electronic component in a plan view. With this configuration, the entire first electronic component can be covered with a laminated body of the magnetic film and metal film.

In the present invention, the magnetic film preferably has a portion that covers a part of the side surface of the mold resin. With this configuration, noise radiated from the first electronic component to the side direction and noise to be incident on the first electronic component from the side direction can be attenuated.

In the present invention, the power supply pattern is preferably exposed to the front surface or the side surface of the substrate, and the first metal film preferably contacts the power supply pattern exposed to the front surface or the side surface of the substrate. With this configuration, the metal film can be easily and reliably connected to the power supply pattern.

In the present invention, the magnetic film may be a film formed of a composite magnetic material in which magnetic fillers are dispersed in a thermosetting resin material, or a thin film, a foil or a bulk sheet formed of a soft magnetic material or a ferrite. When the film formed of a composite magnetic material is used, the magnetic filler is preferably formed of a ferrite or a soft magnetic metal, and a surface of the filler is preferably insulation-coated.

Preferably, in the present invention, the metal film is mainly composed of at least one metal selected from a group consisting of Au, Ag, Cu, and Al, and more preferably, the surface of the metal film is covered with an antioxidant film.

As described above, according to the present invention, it is possible to realize both high composite shielding effect and reduction in height.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

<First Embodiment>

Figure 1:
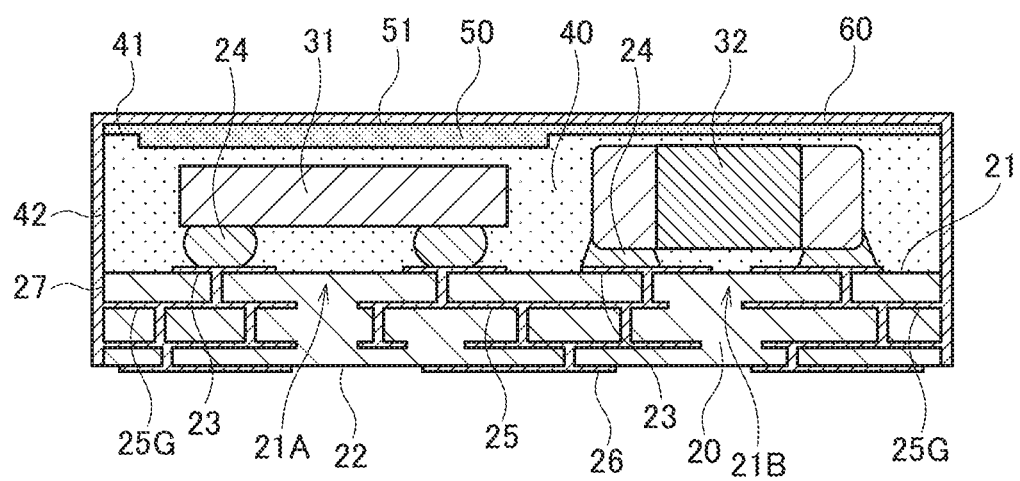
FIG. 1 is a cross-sectional view illustrating a configuration of an electronic circuit package 11A according to a first embodiment of the present invention.

FIG. 1 is a cross-sectional view illustrating a configuration of an electronic circuit package 11A according to the first embodiment of the present invention.

As illustrated in FIG. 1, the electronic circuit package 11A according to the present embodiment includes a substrate 20, a plurality of electronic components 31 and 32 mounted on the substrate 20, a mold resin 40 covering a front surface 21 of the substrate 20 so as to embed the electronic components 31 and 32, a magnetic film 50 formed on an upper surface 41 of the mold resin 40, and a metal film 60 covering a side surfaces 42 of the mold resin 40 and an upper surface 51 of the magnetic film 50.

Although the type of the electronic circuit package 11A according to the present embodiment is not especially limited, examples thereof include a high-frequency module handling a high-frequency signal, a power supply module performing power supply control, an SIP (System-In-Package) having a 2.5D structure or a 3D structure, and a semiconductor package for radio communication or digital circuit. Although only two electronic components 31 and 32 are illustrated in FIG. 1, more electronic components are incorporated actually.

The substrate 20 has a double-sided and multilayer wiring structure in which a large number of wirings are embedded therein and may be any type of substrate including: a thermosetting resin based organic substrate such as an FR-4, an FR-5, a BT, a cyanate ester substrate, a phenol substrate, or an imide substrate; a thermoplastic resin based organic substrate such as a liquid crystal polymer; an LTCC substrate; an HTCC substrate; and a flexible substrate. In the present embodiment, the substrate 20 has a four-layer structure including wiring layers formed on the front surface 21 and a back surface 22 and two wiring layers embedded therein. Land patterns 23 are an internal electrode for connecting to the electronic components 31 and 32. The land patterns 23 and each of the electronic components 31 and 32 are electrically and mechanically connected to each other through a respective solder 24 (or a conductive paste). For example, the electronic component 31 is a semiconductor chip such as a controller, and electronic component 32 is a passive component such as a capacitor or a coil. Some electronic components (e.g., thinned semiconductor chip) maybe embedded in the substrate 20.

The electronic component 31 as a semiconductor chip is mounted in a first region 21A of the surface 21 of the substrate 20, and the electronic component 32 as a passive component is mounted in a second region 21B of the surface 21 of the substrate 20. The first region 21A and the second region 21B are different regions in a plan view. In the present embodiment, the electronic component 31 mounted in the first region 21A is lower in height than the electronic component 32 mounted in the second region 21B. Further, the electronic component 31 easily generates noise or is subject to external noise. In the present embodiment, a composite shield characteristic is selectively enhanced to the electronic component 31.

The land patterns 23 are connected to external terminals 26 formed on the back surface 22 of the substrate 20 through internal wirings 25 formed inside the substrate 20. Upon actual use, the electronic circuit package 11A is mounted on an unillustrated mother board, and land patterns on the mother board and the external terminals 26 of the electronic circuit package 11A are electrically connected. A material for a conductor forming the land patterns 23, internal wirings 25, and external terminals 26 may be a metal such as copper, silver, gold, nickel, chrome, aluminum, palladium, indium, or a metal alloy thereof or may be a conductive material using resin or glass as a binder; however, when the substrate 20 is an organic substrate or a flexible substrate, copper or silver is preferably used in terms of cost and conductivity. The above conductive materials may be formed by using various methods such as printing, plating, foil lamination, sputtering, vapor deposition, and inkjet.

Out of the internal wirings 25 illustrated in FIG. 1, internal wirings 25G are power supply patterns. The power supply patterns 25G are typically ground patterns to which a ground potential is to be applied; however, it is not limited to the ground patterns as long as the power supply patterns 25G are a pattern to which a fixed potential is to be applied.

The mold resin 40 covers the surface 21 of the substrate 20 so as to embed therein the electronic components 31 and 32. In the present embodiment, a side surface 42 of the mold resin 40 and a side surface 27 of the substrate 20 form the same plane. As a material for the mold resin 40, a material based on a thermosetting material or a thermoplastic material and blended with fillers for adjusting a thermal expansion coefficient can be used.

An upper surface 41 of the mold resin 40 has a concave portion 47 above the first region 21A in which the electronic component 31 is mounted. Thus, at the position corresponding to the concave portion 47, the thickness of the mold resin 40 is smaller than that of the other portion. In particular, the concave portion 47 is not formed above the second region 21B in which the electronic component 32 is mounted, so that the thickness of the mold resin 40 on the first region 21A is smaller than the thickness of the mold resin 40 on the second region 21B. In the present embodiment, the planar size of the concave portion 47 is larger than the planar size of the electronic component 31, whereby the concave portion 47 overlaps the entire electronic component 31 in a plan view. In the present embodiment, the electronic component 31 is smaller in height than the electronic component 32, so that it is possible to form the concave portion 47 having the above configuration without increasing the thickness of the entire mold resin 40. The bottom surface of the concave portion 47 may be disposed at a position higher than the upper surface of the electronic component 32.

The magnetic film 50 is formed on the upper surface 41 of the mold resin 40 so as to fill the concave portion 47. Thus, the magnetic film 50 is relatively thick above the first region 21A and is relatively thin above the second region 21B. Hence, even with the presence of the magnetic film 50, increasing the height of the entire electronic circuit package 11A can be minimized.

Although not limited, the magnetic film 50 preferably directly contacts the mold resin 40 without intervention of an adhesive. The magnetic film 50 is a film formed of a composite magnetic material in which magnetic fillers are dispersed in a thermosetting resin material, a thin film formed of a soft magnetic material or ferrite, or formed of a foil or a bulk sheet and functions as a magnetic shield.

When the film formed of a composite magnetic material is selected as the magnetic film 50, an epoxy resin, a phenol resin, a silicone resin, a diallyl phthalate resin, a polyimide resin, an urethane resin, and the like may be used as the thermosetting resin material, and the magnetic film 50 can be formed by using a thick-film formation method such as a printing method, a molding method, a slit nozzle coating method, a spray method, a dispensing method, an injection method, a transfer method, a compression molding method, or a lamination method using an uncured sheet-like resin. Using the thermosetting resin material can increase reliability (heat resistance, insulation performance, impact resistance, falling resistance) required for electronic circuit packages.

As the magnetic filler, a ferrite or a soft magnetic metal is preferably used, and a soft magnetic metal having a high bulk permeability is more preferably used. As the ferrite or soft magnetic metal, one or two or more metals selected from a group consisting of Fe, Ni, Zn, Mn, Co, Cr, Mg, Al, and Si and oxides thereof may be used. Specific examples include a ferrite (Ni—Zn ferrite, Mn—Zn ferrite, Ni—Cu—Zn ferrite, etc.), a permalloy (Fe—Ni alloy), a super permalloy (Fe—Ni—Mo alloy), a sendust (Fe—Si—Al alloy), an Fe—Si alloy, an Fe—Co alloy, an Fe—Cr alloy, an Fe—Cr—Si alloy, Fe—Ni—Co alloy, and Fe. The shape of the magnetic filler is not especially limited; however, it may be formed into a spherical shape for a high filling level, and fillers of a plurality of particle sizes may be blended for a densest filling structure. In order to maximize a shield effect by a permeability real component and a thermal conversion effect by a loss of a permeability imaginary component, the magnetic filler is more preferably formed by adding flat powder having an aspect ratio of 5 or more.

Preferably, the surface of the magnetic filler is insulation-coated by an oxide of a metal such as Si, Al, Ti, or Mg, or an organic material for enhancing fluidity, adhesion, and insulation performance. The insulation coating may be formed by coating a thermosetting material on the surface of the magnetic filler. Alternatively, an oxide film may be formed as the insulation coating by dehydration reaction of a metal alkoxide, and in this case, formation of a silicon oxide coating film is most preferable. More preferably, organic functional coupling treatment is applied to the formed coating film.

The composite magnetic material can be formed on the entire upper surface 41 of the mold resin 40 including the concave portion 47 using a known method such as a printing method, a molding method, a slit nozzle coating method, a spray method, a dispensing method, or a lamination method using an uncured sheet-like resin.

When the thin film formed of a soft magnetic material or a ferrite is selected as the magnetic film 50, one or two or more metals selected from a group consisting of Fe, Ni, Zn, Mn, Co, Cr, Mg, Al, and Si and oxides thereof may be used. In this case, the magnetic film 50 can be formed on the entire upper surface 41 of the mold resin 40 including the concave portion 47 of the mold resin 40 by using a plating method, a spray method, an AD method, and a thermal spraying method, as well as a thin-film formation method such as a sputtering method or a vapor-deposition method. In this case, the material for the magnetic film 50 may be appropriately selected from a required permeability and frequency; however, in order to enhance a shield effect on a lower frequency side (kHz to 100 MHz), an Fe—Co alloy, an Fe—Ni alloy, an Fe—Al alloy, or an Fe—Si alloy is most preferably used. On the other hand, in order to enhance a shield effect on a higher frequency side (50 to several hundreds of MHz), a ferrite film formed of NiZn, MnZn, or NiCuZn, or Fe is most preferably used.

When a foil or a bulk sheet is used as a part of the magnetic film 50, the foil or bulk sheet may be previously processed into a size corresponding to the planar size of the concave portion 47 and then adhered to the concave portion 47 of the mold resin 40 so as to fill the concave portion 47. Thereafter, a thin film formed of a soft magnetic material or a ferrite, another foil, or another bulk sheet may be formed on the planarized upper surface 41 of the mold resin 40.

The top surface 51 of the magnetic film 50, the top and side surfaces 41 and 42 of the mold resin 40 and the side surface 27 of the substrate 20 are covered with the metal film 60. The metal film 60 serves as an electromagnetic shielding and is preferably mainly composed of at least one metal selected from a group consisting of Au, Ag, Cu, and Al. The metal film 60 preferably has a resistance as low as possible and most preferably uses Cu in terms of cost. An outer surface of the metal film 60 is preferably covered with an anticorrosive metal such as SUS, Ni, Cr, Ti, or brass or an antioxidant film made of a resin such as an epoxy resin, a phenol resin, an imide resin, an urethane resin, or a silicone resin. The reason for this is that the metal film 60 undergoes oxidative deterioration by an external environment such as heat or humidity; and, therefore, the aforementioned treatment is preferable to suppress and prevent the oxidative deterioration. A formation method for the metal film 60 may be appropriately selected from known methods, such as a sputtering method, a vapor-deposition method, an electroless plating method, an electrolytic plating method. Before formation of the metal film 60, pretreatment for enhancing adhesion, such as plasma treatment, coupling treatment, blast treatment, or etching treatment, may be performed. As a base of the metal film 60, a high adhesion metal film such as a titanium film, a chromium film, or an SUS film may be formed thinly in advance.

As illustrated in FIG. 1, the power supply patterns 25G are exposed to the side surfaces 27 of the substrate 20. The metal film 60 covers the side surfaces 27 of the substrate 20 and is thereby electrically connected to the power supply pattern 25G. The metal film 60 may contact to the power supply pattern 25G formed on the front surface 21 of the substrate 20.

Although not especially limited, it is desirable that a resistance value at an interface between the metal film 60 and the magnetic film 50 is equal to or larger than $10^6 \Omega$. According to this configuration, an eddy current generated when electromagnetic wave noise enters the metal film 60 hardly flows in the magnetic film 50, which can prevent deterioration in the magnetic characteristics of the magnetic film 50 due to inflow of the eddy current. The resistance value at the interface between the metal film 60 and the magnetic film 50 refers to a surface resistance of the magnetic film 50 when the metal film 60 and magnetic film 50 directly contact each other and to a surface resistance of an insulating film when the insulating film is present between the metal film 60 and the magnetic film 50.

In order to make a resistance value at an interface between the metal film 60 and the magnetic film 50 equal to or higher than $10^6 \Omega$, a material having a sufficiently high surface resistance is used as the material for the magnetic film 50 or a thin insulating material is formed on the top surface 51 of the magnetic film 50.

As described above, in the electronic circuit package 11A according to the present embodiment, the upper surface 41 of the mold resin 40 is covered with a laminated film of the magnetic film 50 and metal film 60, enabling a composite shield structure for the electronic components 31 and 32 mounted on the substrate 20 to be obtained. Further, since a thickness of the magnetic film 50 is selectively increased above the electronic component 31 for which noise countermeasures are particularly required, a composite shield characteristic to the electronic component 31 is enhanced. Particularly, in the present embodiment, the magnetic film 50 and the metal film 60 are laminated in this order, so that electromagnetic wave noise radiated from the electronic component 31 is shielded more effectively than in the case where the lamination order thereof is reversed. This is because the electromagnetic wave noise radiated from the electronic component 31 is partially absorbed when passing through the magnetic film 50, and part of the electromagnetic wave noise that has not been absorbed by the magnetic film 50 is reflected by the metal film 60 and passes again through the magnetic film 50. As described above, the magnetic film 50 acts twice on the electromagnetic wave noise incident thereon, thereby making it possible to effectively shield the electromagnetic wave noise radiated from the electronic component 31.

Further, in the present embodiment, the concave portion 47 is formed on the upper surface 41 of the mold resin 40 and a part of the magnetic film 50 is buried in the concave portion 47, so that an increase in the height of the entire electronic circuit package 11A due to addition of the magnetic film 50 can be eliminated, whereby a demand for height reduction can be satisfied.

Further, the magnetic film 50 is formed directly on the upper surface 41 of the mold resin 40, that is, an adhesive or the like is not interposed between the magnetic film 50 and the mold resin 40, which is advantageous for height reduction of a product. In addition, in the present embodiment, the magnetic film 50 is formed only on the upper surface 41 of the mold resin 40, enabling the metal film 60 to be easily connected to the power supply pattern 25G.

The following describes a manufacturing method for the electronic circuit package 11A according to the present embodiment.

FIGS. 2 to 5 are process views for explaining a manufacturing method for the electronic circuit package 11A.

Figure 2:
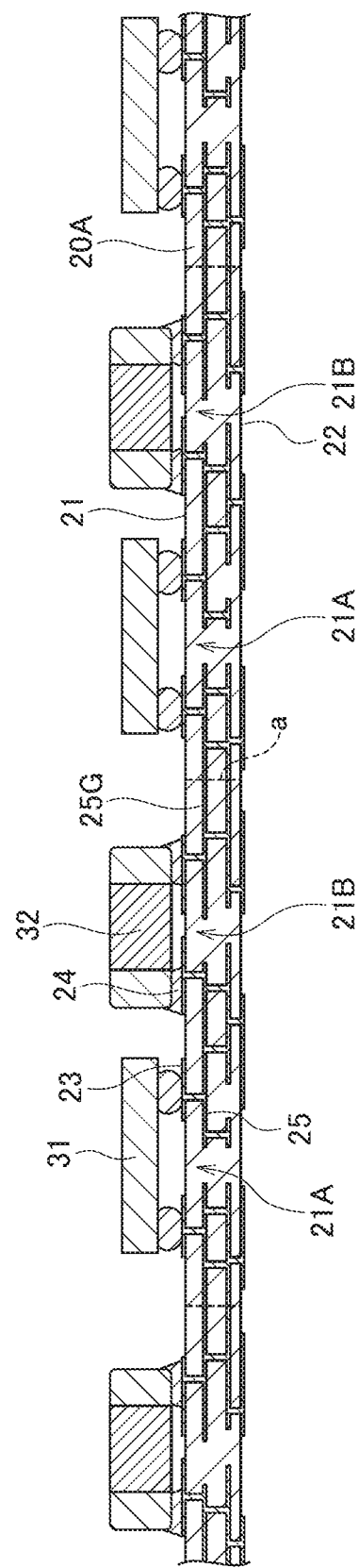
FIGS. 2 to 5 are process views for explaining a manufacturing method for the electronic circuit package 11A.

As illustrated in FIG. 2, an assembly substrate 20A having a multilayer wiring structure is prepared. A plurality of the land patterns 23 are formed on the front surface 21 of the assembly substrate 20A, and a plurality of the external terminals 26 are formed on the back surface 22 of the assembly substrate 20A. Further, a plurality of the internal wirings 25 including the power supply patterns 25G are formed in an inner layer of the assembly substrate 20A. A dashed line a in FIG. 2 denotes apart to be cut in a subsequent dicing process. As illustrated in FIG. 2, the power supply patterns 25G are provided at a position overlapping the dashed line a in a plan view.

Then, as illustrated in FIG. 2, the plurality of electronic components 31 and 32 are mounted on the front surface 21 of the assembly substrate 20A so as to be connected to the land patterns 23. Specifically, the solder 24 is provided on the land pattern 23, followed by mounting of the electronic components 31 and 32 and by reflowing, whereby the electronic components 31 and 32 are connected to the land patterns 23.

Figure 3:
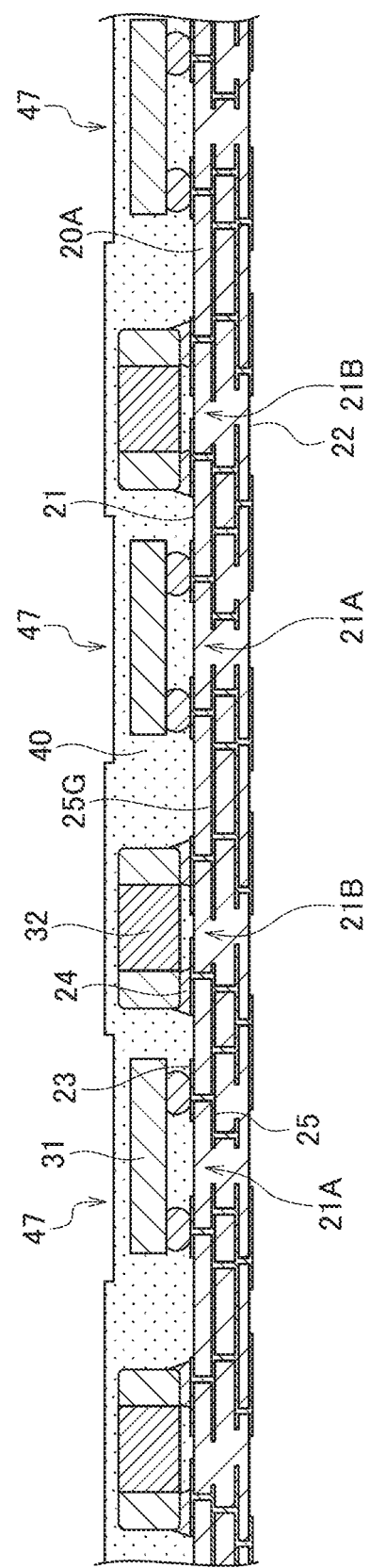

Then, as illustrated in FIG. 3, the mold resin 40 is used to cover the surface 21 of the assembly substrate 20A so as to embed the electronic components 31 and 32 therein. As a formation method for the mold resin 40, a compression method, an injection method, a print method, a dispense method, a nozzle coating method, or the like can be used. The mold resin 40 is formed so as to form the concave portion 47 above the first region 21A, that is, at a part thereof that covers the electronic component 31.

Figure 6:
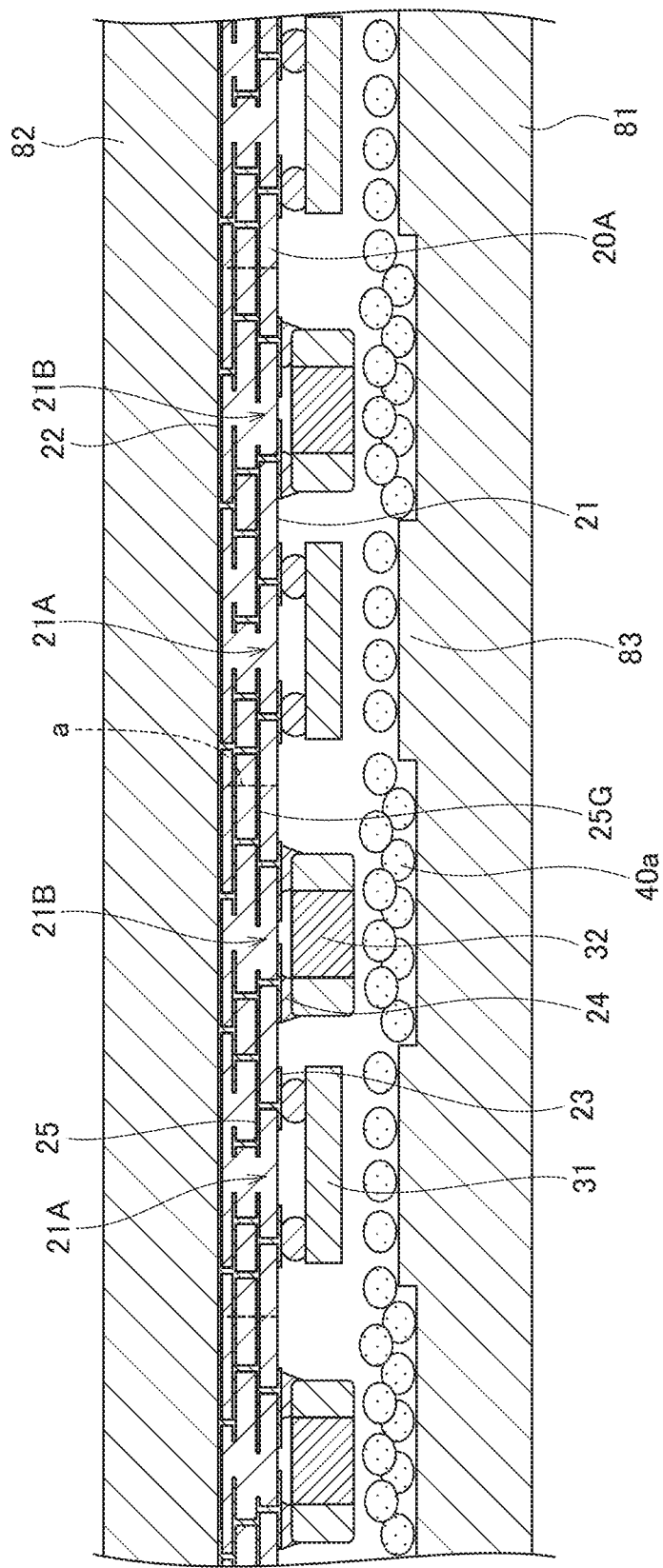
FIG. 6 is a process view for explaining a first method for forming a concave portion 47 in a mold resin 40.

As a method for forming the concave portion 47 in the mold resin 40, there can be adopted a method as illustrated in FIG. 6. That is, a convex portion 83 corresponding to the concave portion 47 is formed in one of two dies 81 and 82 for pressing a molding material 40a. In this example, the convex portion 83 is formed in the die 81 positioned on the upper surface 41 side of the mold resin 40. According to this method, it is possible to form the concave portion 47 in the mold resin 40 without increasing the number of processes.

Figure 7:
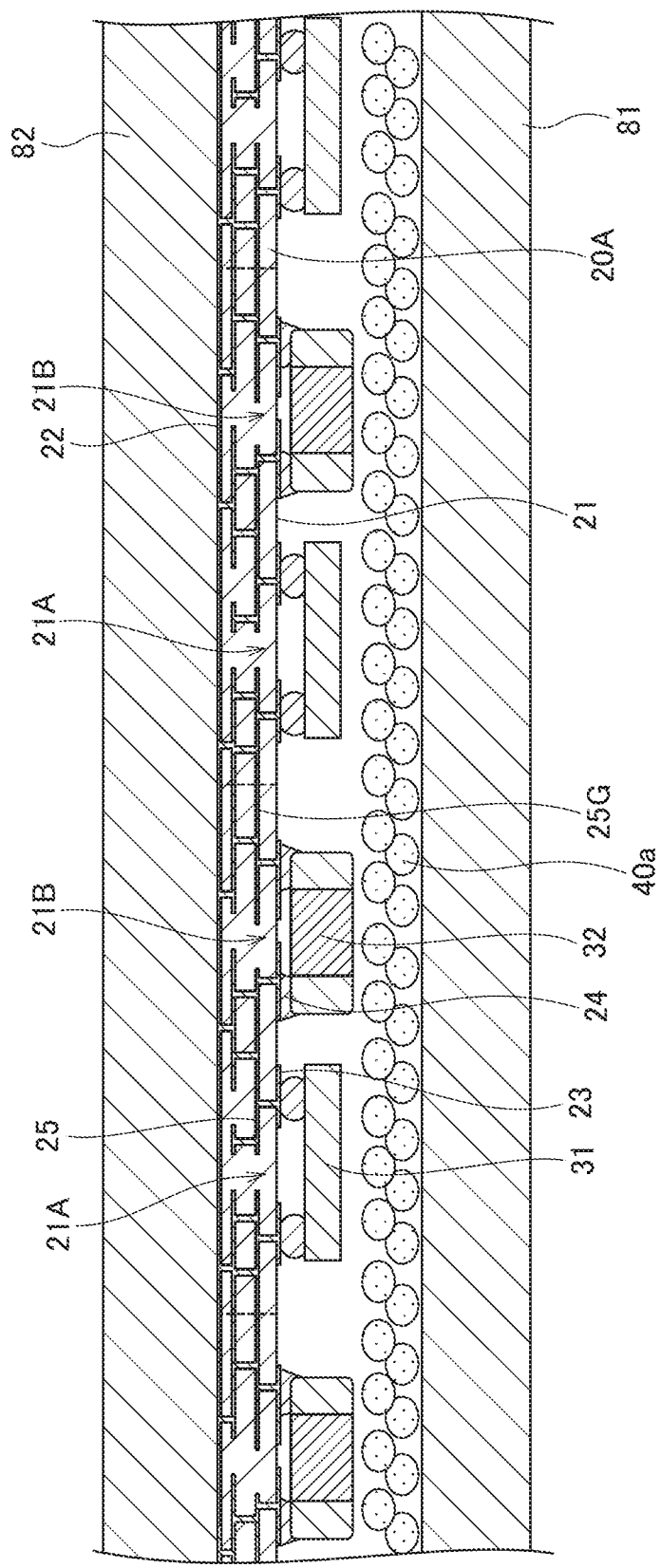
FIGS. 7 and 8 are process views for explaining a second method for forming a concave portion 47 in a mold resin 40.
Figure 8:
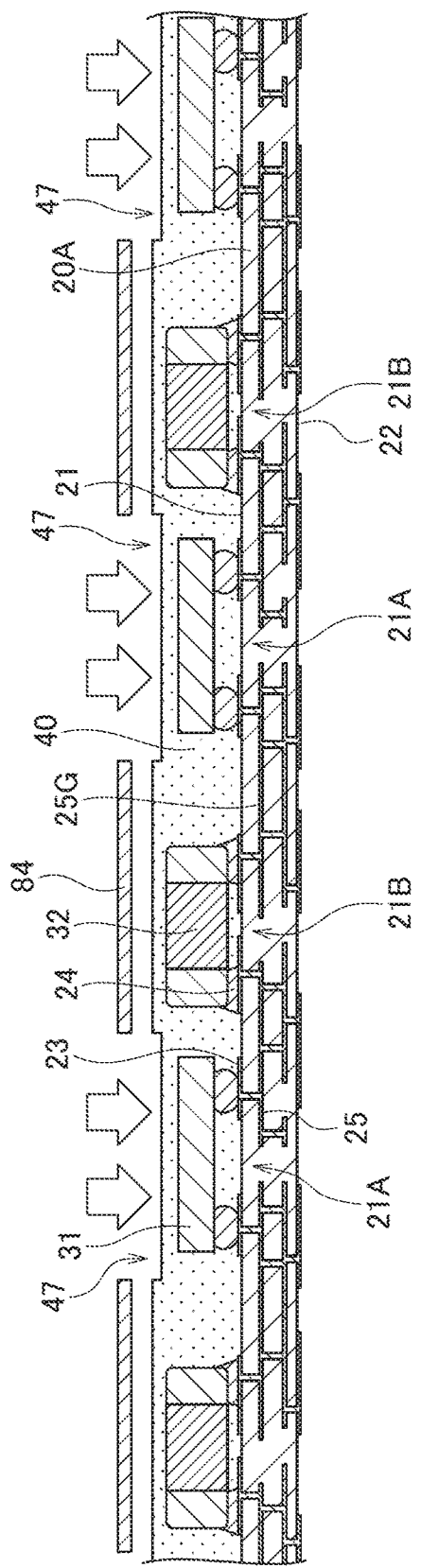
Figure 9:
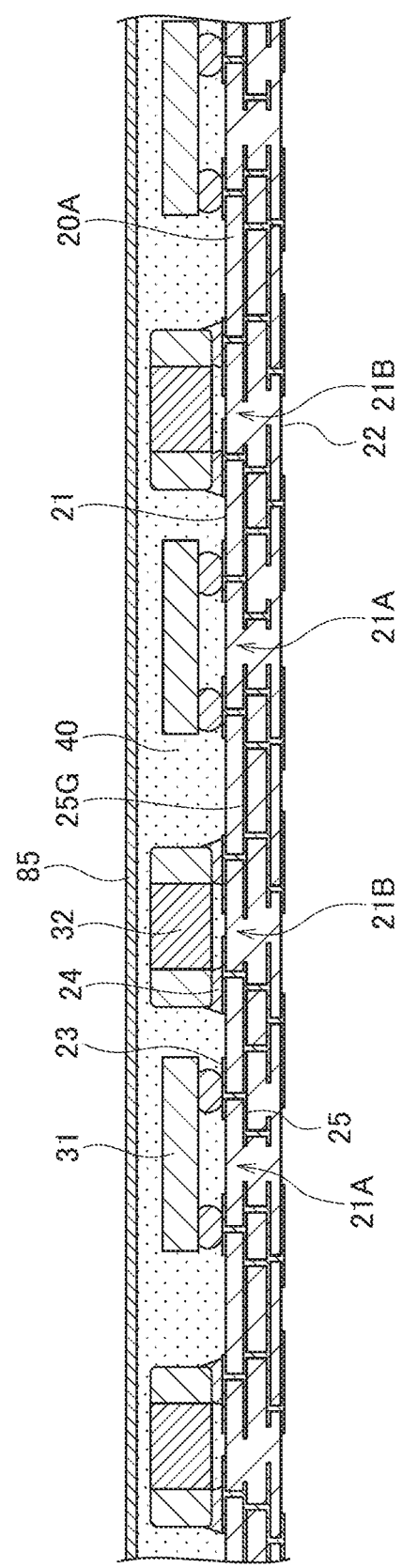
FIGS. 9 to 11 are process views for explaining a third method for forming a concave portion 47 in a mold resin 40.
Figure 10:
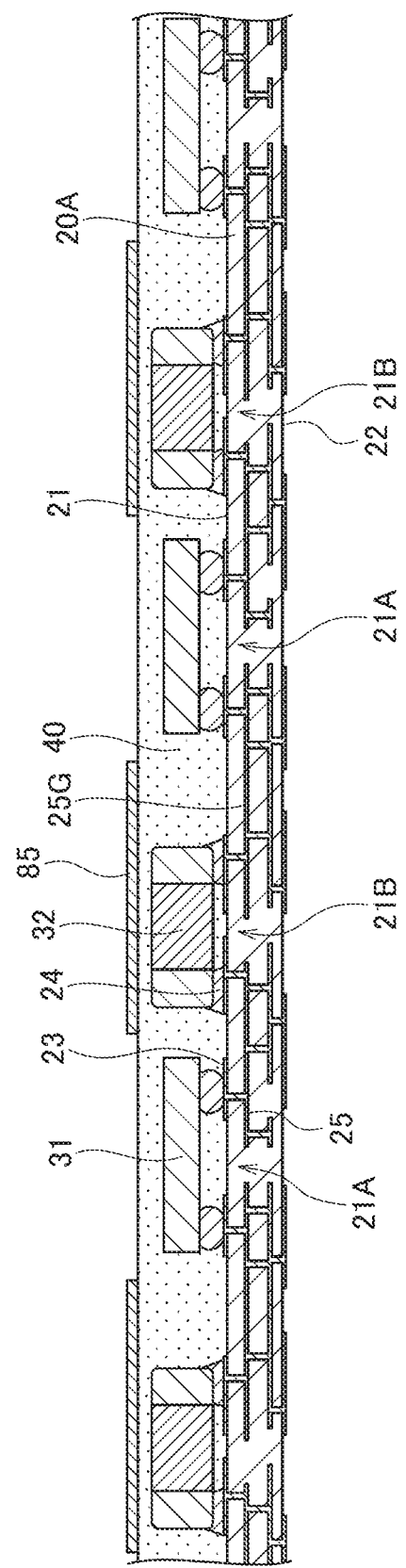
Figure 11:
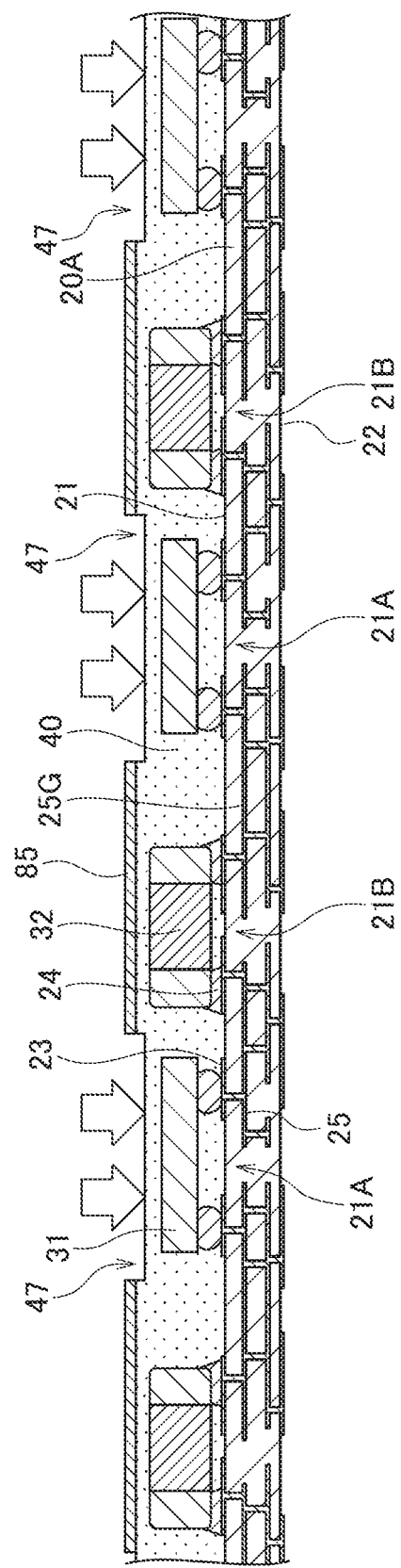

Alternatively, dies 81 and 82 that do not have the convex portion 83 are used to press the molding material 40a as illustrated in FIG. 7, and then blasting is performed through a mask 84 having an opening corresponding to the first region 21A as illustrated in FIG. 8. Further alternatively, a metal film 85 is formed on the flat upper surface 41 of the mold resin 40 as illustrated in FIG. 9, then the metal film 85 corresponding to the first region 21A is removed by patterning as illustrated in FIG. 10, and then blasting is performed through the patterned metal film 85 as illustrated in FIG. 11.

Figure 4:
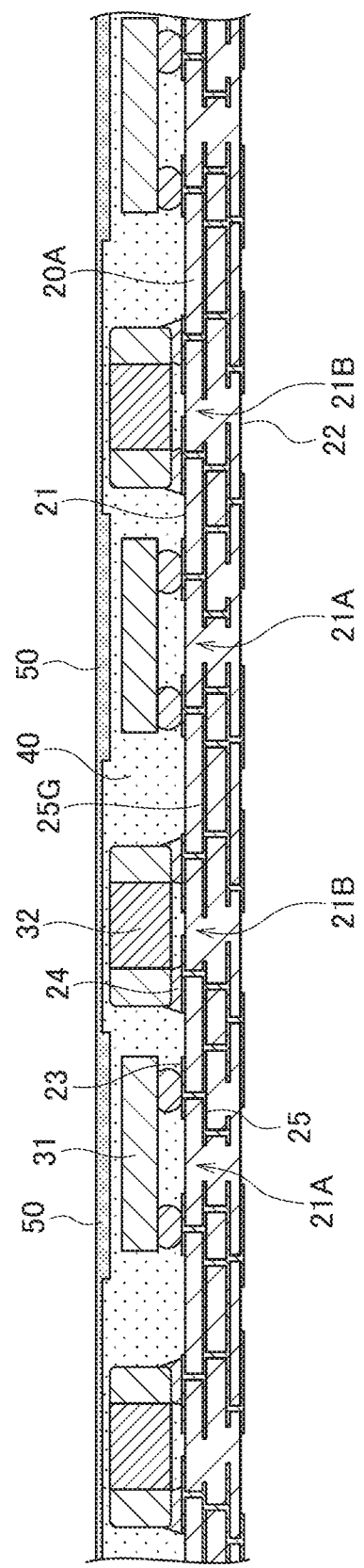

After the mold resin 40 having the concave portion 47 is thus formed, the magnetic film 50 is formed on the upper surface 41 of the mold resin 40 so as to fill the concave portion 47 of the mold resin 40 as illustrated in FIG. 4. In order to enhance adhesion between the mold resin 40 and the magnetic film 50, the upper surface 41 of the mold resin 40 may be subjected to blasting or etching to form a physical irregularity thereon, may be subjected to surface modification by means of plasma or short wavelength UV, or may be subjected to organofunctional coupling treatment.

When the film formed of a composite magnetic material is used as the magnetic film 50, a thick-film formation method such as a printing method, a molding method, a slit nozzle coating method, a spray method, a dispensing method, an injection method, a transfer method, a compression molding method, or a lamination method using an uncured sheet-like resin can be used. When the magnetic film 50 is formed by using the printing method, slit nozzle method, spraying method, or dispensing method, the viscosity of the composite magnetic material is preferably controlled as needed. The viscosity control may be made by diluting the composite magnetic material with one or two or more solvents having a boiling point of 50° C. to 300° C. The thermosetting material mainly consists of a main agent, a curing agent, and a curing accelerator; however, two or more kinds of main agent or curing agent may be blended according to required characteristics. Further, two or more kinds of solvents maybe mixed: a coupling agent for enhancing adhesion and fluidity, a fire retardant for flame retardancy, a dye and a pigment for coloration, a non-reactive resin material for imparting flexibility, and a non-magnetic filler for adjusting a thermal expansion coefficient may be blended. The materials may be kneaded or dispersed by a known means such as a kneader, a mixer, a vacuum defoaming stirring machine, or a three-roll mill.

Further, when a thin film formed of a soft magnetic material or ferrite is used as the magnetic film 50, a plating method, a spraying method, an SD method, or a thermal spraying method may be used as well as a thin film formation method such as a sputtering method or vapor deposition method. When a thin film formed of a foil or a bulk sheet is used as the magnetic film 50, the foil or bulk may previously be cut according to the planar size of the concave portion 47 and then adhered to the concave portion 47 by an adhesive or the like. Thereafter, a thin film formed of a composite magnetic material, a thin film formed of a soft magnetic material or a ferrite, another foil, or another bulk sheet may be formed.

Figure 5:
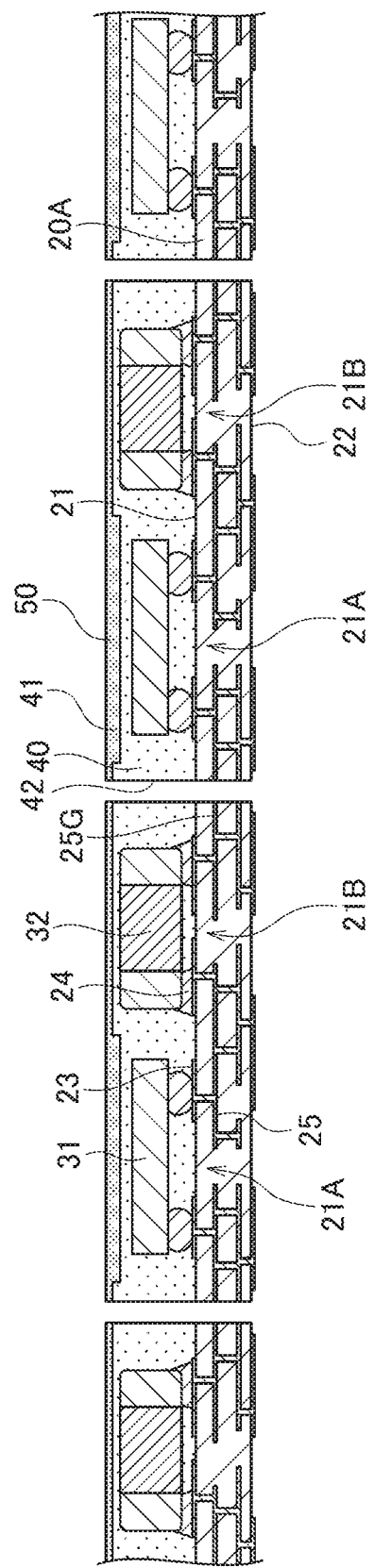

Then, as illustrated in FIG. 5, the assembly substrate 20A is cut along the dashed line a to divide the assembly substrate 20A into individual substrates 20. In the present embodiment, the power supply patterns 25G pass the dashed line a as a dicing position. Thus, when the assembly substrate 20A is cut along the dashed line a, the power supply patterns 25G are exposed from the side surface 27 of the substrate 20.

Then, the metal film 60 is formed so as to cover the top surface 51 of the magnetic film 50, the top and side surfaces 41 and 42 of the mold resin 40, and side surface 27 of the substrate 20, whereby the electronic circuit package 11A according to the present embodiment is completed. Examples of a formation method for the metal film 60 may include a sputtering method, a vapor-deposition method, an electroless plating method, and an electrolytic plating method. Before formation of the metal film 60, pretreatment for enhancing adhesion, such as plasma treatment, coupling treatment, blast treatment, or etching treatment, may be performed. As a base of the metal film 60, a high adhesion metal film such as a titanium film or a chromium film may be formed thinly in advance.

As described above, according to the manufacturing method for the electronic circuit package 11A of the present embodiment, the concave portion 47 is formed simultaneously with or after formation of the mold resin 40, and the magnetic film 50 is formed on the entire upper surface 41 of the mold resin 40 so as to fill the concave portion 47, so that it is possible to cover the region above the electronic components 31 and 32 with the laminated film of the magnetic film 50 and metal film 60 with increasing the height of the entire electronic circuit package 11A be minimized. Further, the assembly substrate 20A is cut off to expose the power supply pattern 25G therethrough, which makes it possible to easily and reliably connect the metal film 60 to the power supply pattern 25G.

Figure 12:
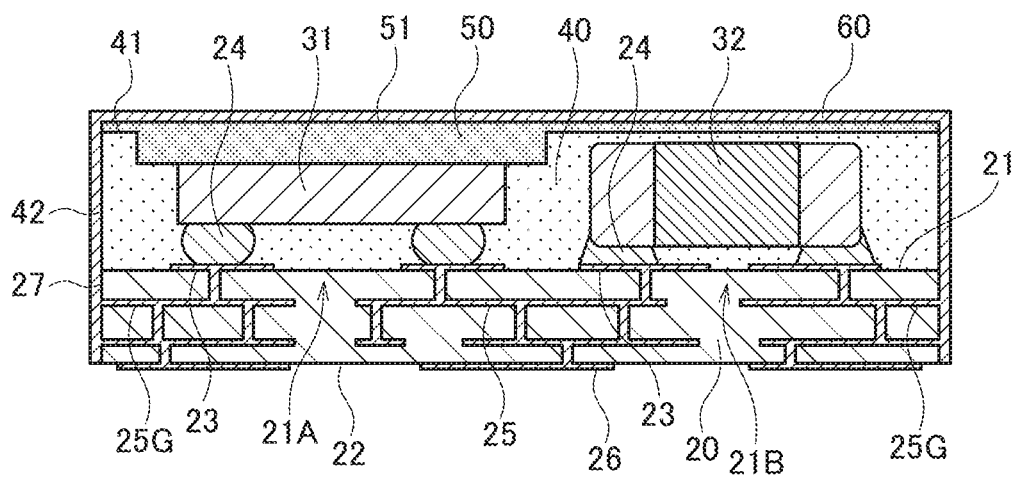
FIG. 12 is a cross-sectional view illustrating a configuration of an electronic circuit package 11B according to a first modification of the first embodiment.

FIG. 12 is a cross-sectional view illustrating a configuration of an electronic circuit package 11B according to a first modification of the first embodiment.

As illustrated in FIG. 12, the electronic circuit package 11B according to the first modification differs from the electronic circuit package 11A illustrated in FIG. 1 in that the upper surface of the electronic component 31 is exposed to the concave portion 47 with the result that the magnetic film 50 is brought into contact with the upper surface of the electronic component 31. Other configurations are the same as those of the electronic circuit package 11A illustrated in FIG. 1. Thus, the same reference numerals are given to the same elements, and overlapping description will be omitted.

According to the configuration illustrated in FIG. 12, the film thickness of the magnetic film 50 above the first region 21A can be made larger, whereby magnetic shielding characteristics can be enhanced. Further, when a material having a thermal conductivity higher than that of the mold resin 40 is used as a material for the magnetic film 50, heat radiation performance for the electronic component 31 can be enhanced. To obtain the structure illustrated in FIG. 12, blasting may be performed in, e.g., a blasting process for formation of the concave portion 47 until the upper surface of the electronic component 31 is exposed. Alternatively, the magnetic film 50 is previously adhered onto the upper surface of the electronic component 31 in a formation process of the mold resin 40 using the dies 81 and 82, followed by molding, and thereafter forming thin magnetic film 50, whereby the structure illustrated in FIG. 12 can be obtained.

Figure 13:
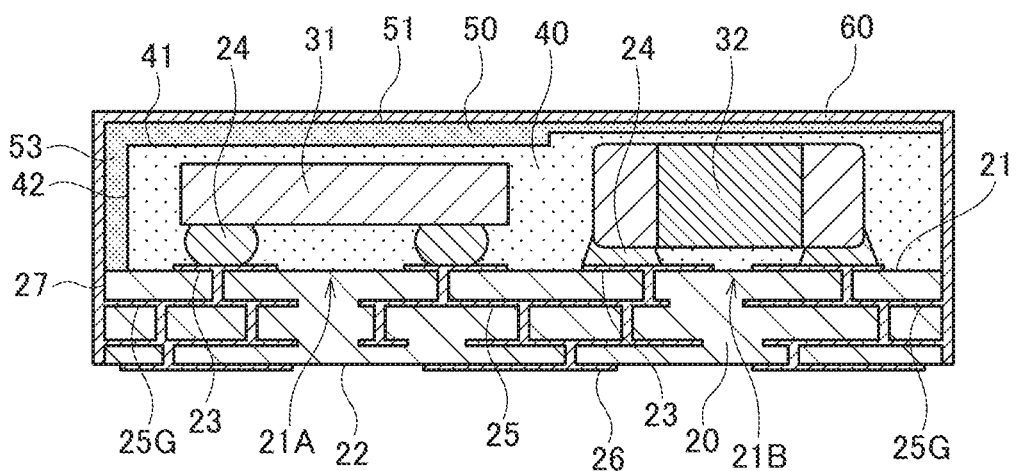
FIG. 13 is a cross-sectional view illustrating a configuration of an electronic circuit package 11C according to a second modification of the first embodiment.

FIG. 13 is a cross-sectional view illustrating a configuration of an electronic circuit package 11C according to a second modification of the first embodiment.

As illustrated in FIG. 13, the electronic circuit package 11C according to the second modification differs from the electronic circuit package 11A illustrated in FIG. 1 in that a side magnetic film 53 as a part of the magnetic film 50 covers a part of a side surface 42 of the mold resin 40. Other configurations are the same as those of the electronic circuit package 11A illustrated in FIG. 1. Thus, the same reference numerals are given to the same elements, and overlapping description will be omitted.

Figure 14:
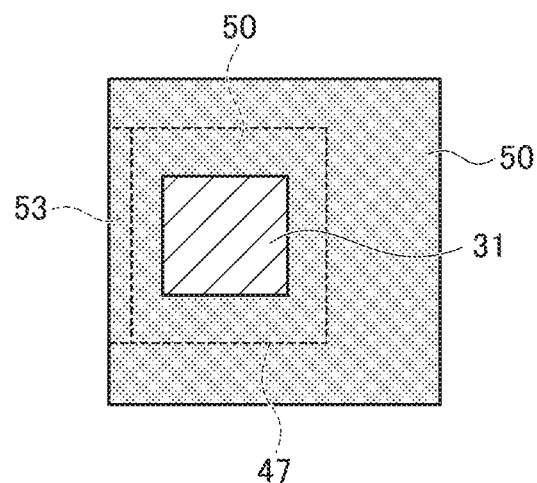
FIG. 14 is a planar view illustrating a first layout of a side magnetic film 53.
Figure 15:
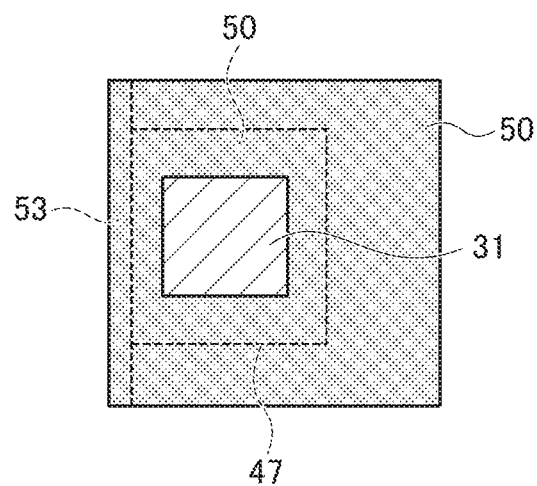
FIG. 15 is a planar view illustrating a second layout of a side magnetic film 53.
Figure 16:
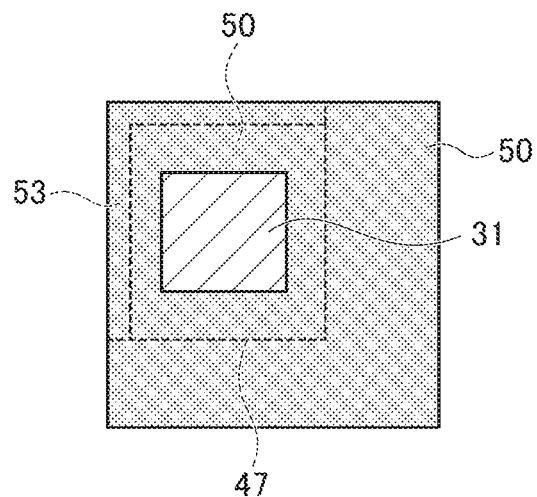
FIG. 16 is a planar view illustrating a third layout of a side magnetic film 53.
Figure 17:
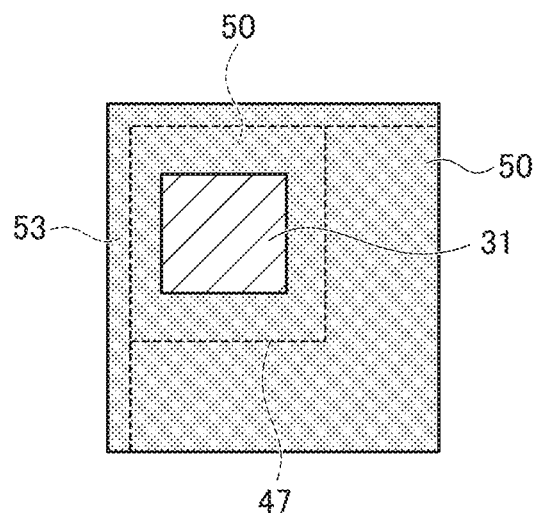
FIG. 17 is a planar view illustrating a fourth layout of a side magnetic film 53.

According to the configuration illustrated in FIG. 13, noise radiated from the electronic component 31 toward the side direction and noise to be incident on the electronic component 31 from the side direction can be attenuated. In this case, the side magnetic film 53 may have a length equal to (see FIG. 14) or longer than (see FIG. 15) the concave portion 47 in a plan view. Further, when the electronic component 31 is disposed near a corner portion of the substrate 20, the side magnetic film 53 may be provided along two sides of the concave portion 47 in a plan view (see FIG. 16). Further, in this case, the lengths of the two sides of the side magnetic film 53 may be extended in a plan view (see FIG. 17). In any cases, the side magnetic film 53 can be formed by forming another concave portion in the region where the side magnetic film 53 is to be formed in a forming process of the concave portion 47 in the mold resin 40 and burying a magnetic material in the another concave portion.

<Second Embodiment>

Figure 18:
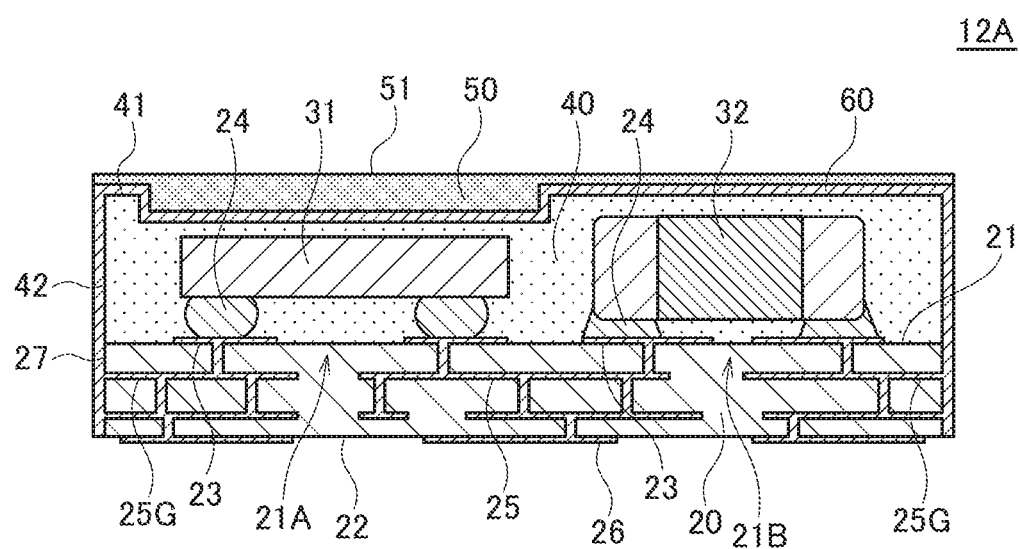
FIG. 18 is a cross-sectional view illustrating a configuration of an electronic circuit package 12A according to a second embodiment of the present invention.

FIG. 18 is a cross-sectional view illustrating a configuration of an electronic circuit package 12A according to a second embodiment.

As illustrated in FIG. 18, the electronic circuit package 12A according to the present embodiment differs from the electronic circuit package 11A illustrated in FIG. 1 in that the lamination order of the magnetic film 50 and the metal film 60 is reversed. That is, the metal film 60 is positioned between the mold resin 40 and the magnetic film 50. Other configurations are the same as those of the electronic circuit package 11A illustrated in FIG. 1. Thus, the same reference numerals are given to the same elements, and overlapping description will be omitted.

In the present embodiment as well, the region above the electronic component 31 for which noise countermeasures are especially required is covered with the laminated film of the metal film 60 and magnetic film 50 having large thickness, enabling a composite shield characteristic to the electronic component 31 to be enhanced. Particularly, in the present embodiment, the metal film 60 and magnetic film 50 are laminated in this order, so that electromagnetic wave noise to be incident on the electronic component 31 is shielded more effectively. This is because external electromagnetic wave noise is partially absorbed by the magnetic film 50 when passing therethrough, and part of the electromagnetic wave noise that has not been absorbed by the magnetic film 50 is reflected by the metal film 60 and passes again through the magnetic film 50. As described above, the magnetic film 50 acts twice on the external electromagnetic wave noise, which makes it possible to effectively shield the external electromagnetic wave noise to be incident on the electronic component 31.

The following describes a manufacturing method for the electronic circuit package 12A according to the present embodiment.

Figure 19:
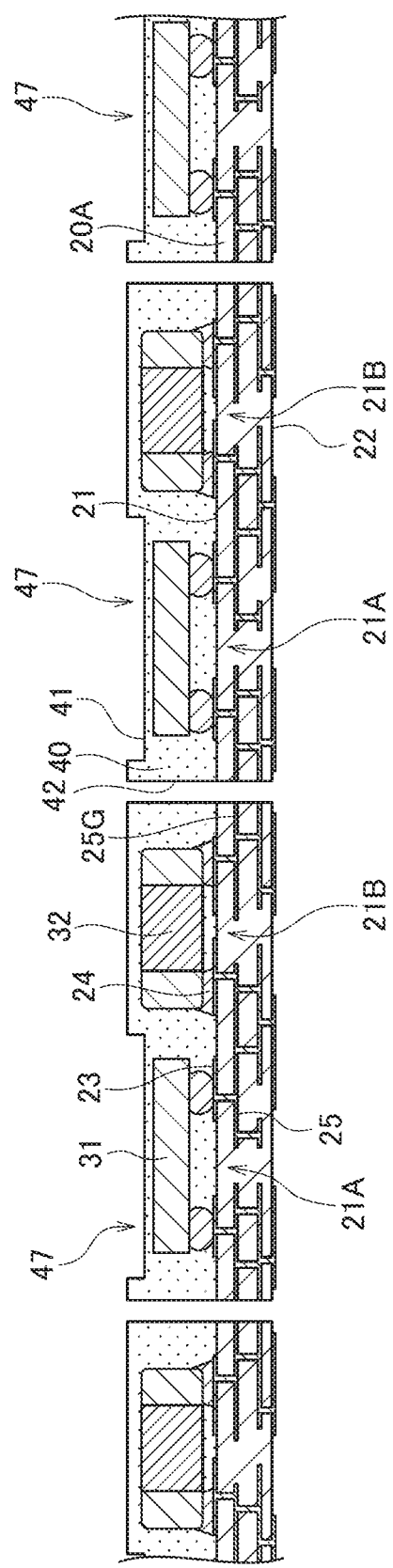
FIGS. 19 and 20 are process views for explaining a manufacturing method for the electronic circuit package 12A.

First, the mold resin 40 having the concave portion 47 is formed on the surface 21 of the assembly substrate 20A according to the method described using FIGS. 2 and 3. Then, as illustrated in FIG. 19, the assembly substrate 20A is cut off along the dashed line a (see FIG. 2) to individuate the substrate 20. As a result, the power supply pattern 25G is exposed to a side surface 27 of the substrate 20.

Figure 20:
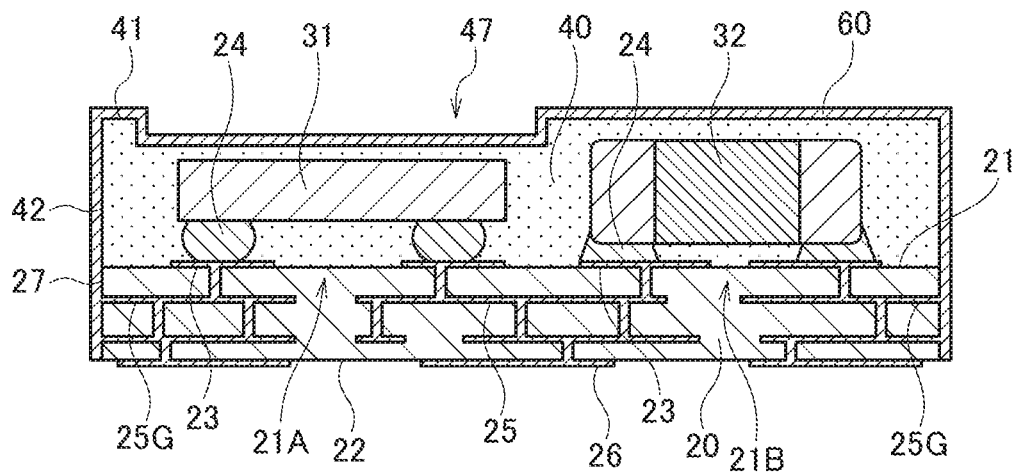

Then, as illustrated in FIG. 20, the metal film 60 is formed so as to cover the upper surface 41 and side surface 42 of the mold resin 40 including the concave portion 47 and the side surface 27 of the substrate 20. As a result, the metal film 60 is connected to the power supply pattern 25G exposed to the side surface 27 of the substrate 20. Further, the concave portion 47 is covered with the metal film 60. At this time, the depth of the concave portion 47 and the thickness of the metal film 60 need to be set so that the concave portion 47 is not completely filled with the metal film 60.

Finally, the magnetic film 50 is formed on the upper surface 41 of the mold resin 40 so as to fill the concave portion 47, whereby the electronic circuit package 12A according to the present embodiment is completed. In this manufacturing method, the metal film 60 is formed before formation of the magnetic film 50, so that the metal film 60 and magnetic film 50 can be laminated in this order.

Figure 21:
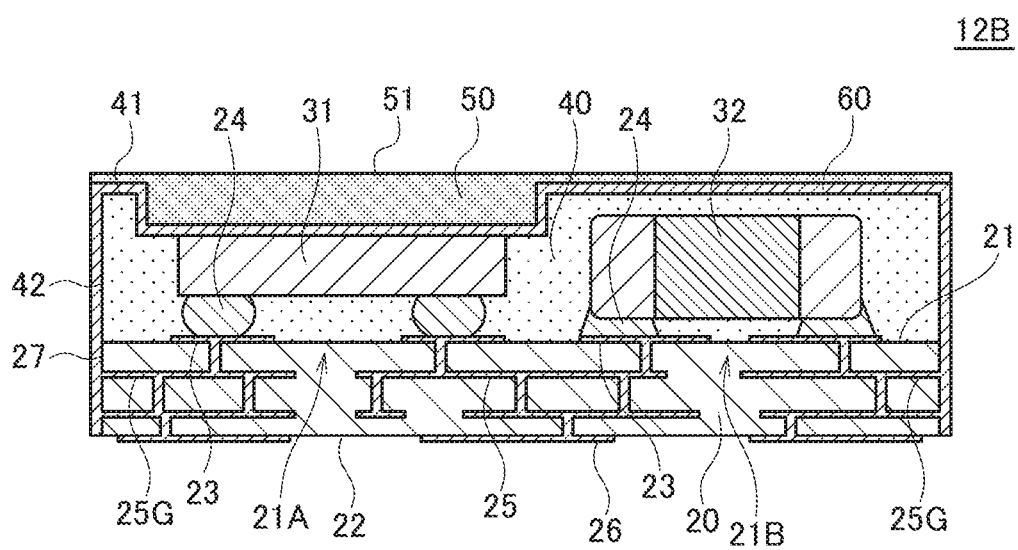
FIG. 21 is a cross-sectional view illustrating a configuration of an electronic circuit package 12B according to a first modification of the second embodiment.

FIG. 21 is a cross-sectional view illustrating a configuration of an electronic circuit package 12B according to a first modification of the second embodiment.

As illustrated in FIG. 21, the electronic circuit package 12B according to the first modification differs from the electronic circuit package 12A illustrated in FIG. 18 in that the upper surface of the electronic component 31 is exposed to the concave portion 47 with the result that the metal film 60 is brought into contact with the upper surface of the electronic component 31. Other configurations are the same as those of the electronic circuit package 12A illustrated in FIG. 18. Thus, the same reference numerals are given to the same elements, and overlapping description will be omitted.

According to the configuration illustrated in FIG. 21, the thickness of the magnetic film 50 above the first region 21A can be made larger, so that magnetic shielding characteristics can be enhanced. In addition, the upper surface of the electronic component 31 contacts the metal film 60 having a high thermal conductivity, so that high heat radiation efficiency can be obtained.

Figure 22:
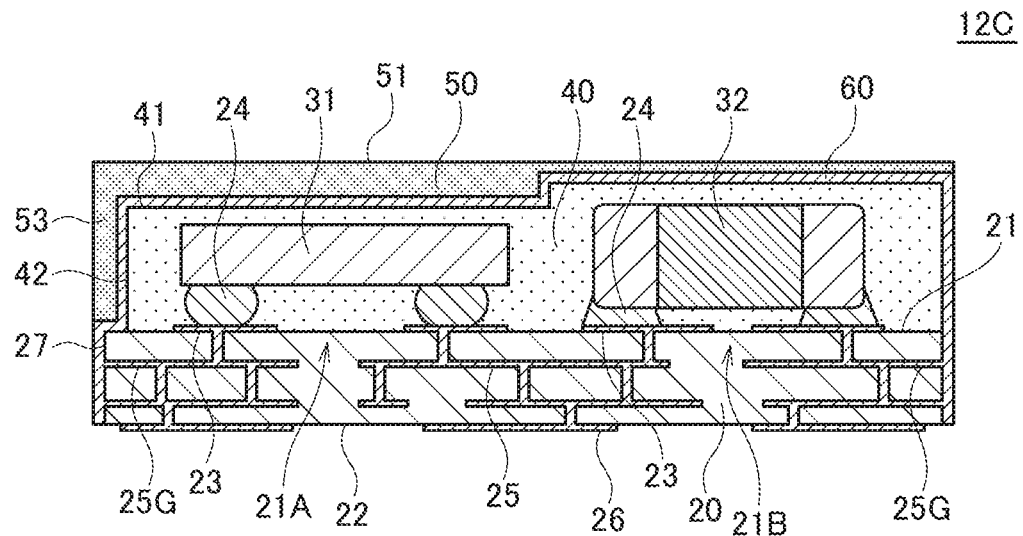
FIG. 22 is a cross-sectional view illustrating a configuration of an electronic circuit package 12C according to a second modification of the second embodiment.

FIG. 22 is a cross-sectional view illustrating a configuration of an electronic circuit package 12C according to a second modification of the second embodiment.

As illustrated in FIG. 22, the electronic circuit package 12C according to the second modification differs from the electronic circuit package 12A illustrated in FIG. 18 in that the side magnetic film 53 as a part of the magnetic film 50 covers a part of the side surface 42 of the mold resin 40. Other configurations are the same as those of the electronic circuit package 12A illustrated in FIG. 18. Thus, the same reference numerals are given to the same elements, and overlapping description will be omitted.

According to the configuration illustrated in FIG. 22, noise radiated from the electronic component 31 toward the side direction and noise to be incident on the electronic component 31 from the side direction can be attenuated. In this case also, the side magnetic film 53 may have a length equal to (see FIG. 14) or longer than (see FIG. 15) the concave portion 47 in a plan view. Further, when the electronic component 31 is disposed near a corner portion of the substrate 20, the side magnetic film 53 may be provided along two sides of the concave portion 47 in a plan view (see FIG. 16). Further, in this case, the lengths of the two sides of the side magnetic film 53 may be extended in a plan view (see FIG. 17).

<Third Embodiment>

Figure 23:
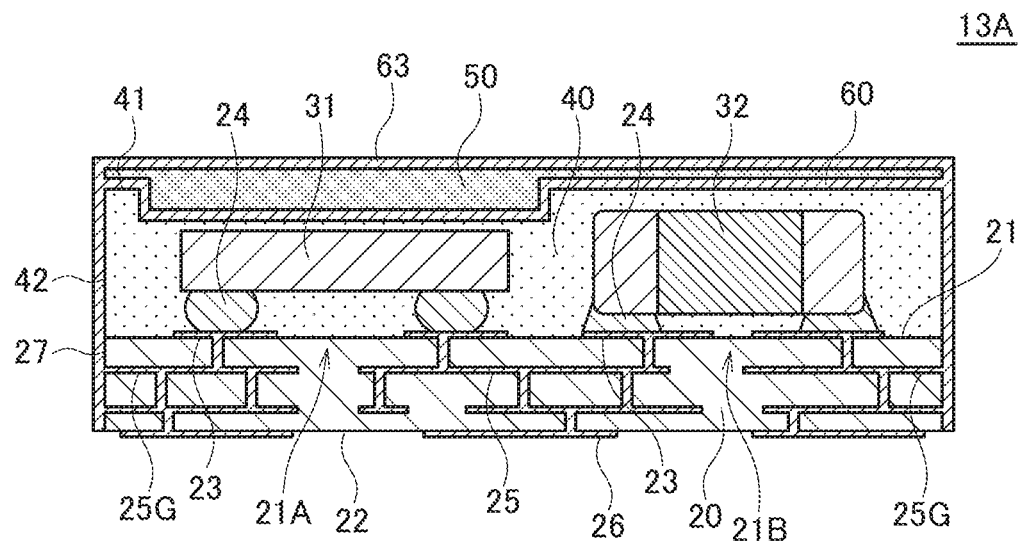
FIG. 23 is a cross-sectional view illustrating a configuration of an electronic circuit package 13A according to a third embodiment of the present invention.

FIG. 23 is a cross-sectional view illustrating a configuration of an electronic circuit package 13A according to a third embodiment of the present invention.

As illustrated in FIG. 23, the electronic circuit package 13A according to the present embodiment differs from the electronic circuit package 12A illustrated in FIG. 18 in that the upper surface of the magnetic film 50 is covered with a metal film 63 different from the metal film 60. Other configurations are the same as those of the electronic circuit package 12A illustrated in FIG. 18. Hence, the same reference numerals are given to the same elements, and overlapping description will be omitted.

In the present embodiment, the upper surface 41 of the mold resin 40 is covered with a three-layer laminated film of the metal film 60 (first metal film), magnetic film 50, and metal film 63 (second metal film), a thickness of the magnetic film 50 is selectively increased above the electronic component 31 for which noise countermeasures are particularly required. Thus, electromagnetic wave noise radiated from the electronic component 31 can be shielded effectively as in the first embodiment, and external electromagnetic wave noise to be incident on the electronic component 31 can be shielded effectively as in the second embodiment. This makes it possible to obtain very high shielding effect while achieving height reduction.

The following describes a manufacturing method for the electronic circuit package 13A according to the present embodiment.

Figure 24:
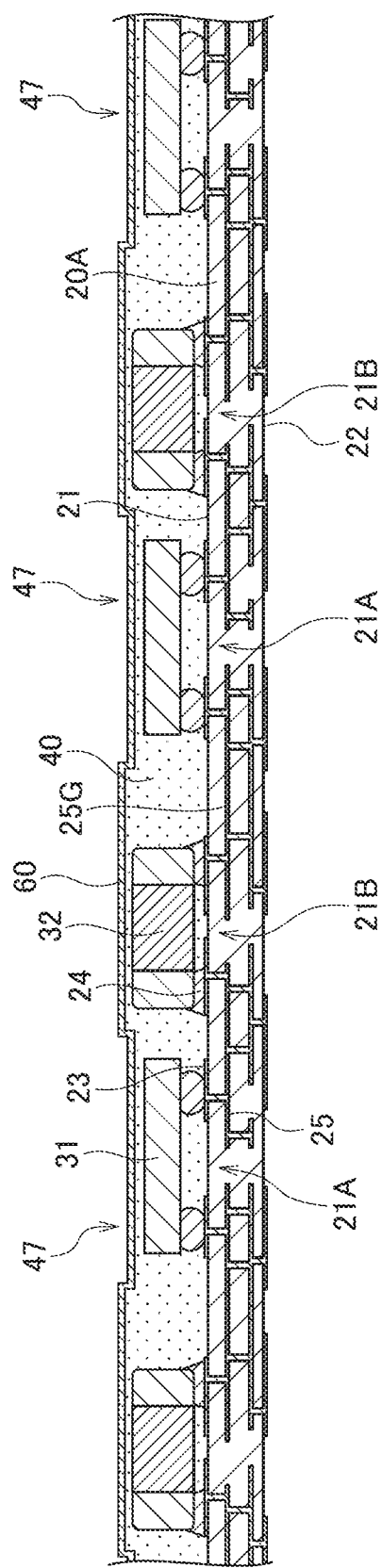
FIGS. 24 to 26 are process views for explaining a manufacturing method for the electronic circuit package 13A.

First, the mold resin 40 having the concave portion 47 is formed on the surface 21 of the assembly substrate 20A according to the method described using FIGS. 2 and 3. Then, as illustrated in FIG. 24, the metal film 60 is formed so as to cover the upper surface 41 of the mold resin 40 including the concave portion 47. As a result, the metal film 60 is formed on the bottom of the concave portion 47. At this time, the depth of the concave portion 47 and the thickness of the metal film 60 need to be set so that the concave portion 47 is not completely filled with the metal film 60.

Figure 25:
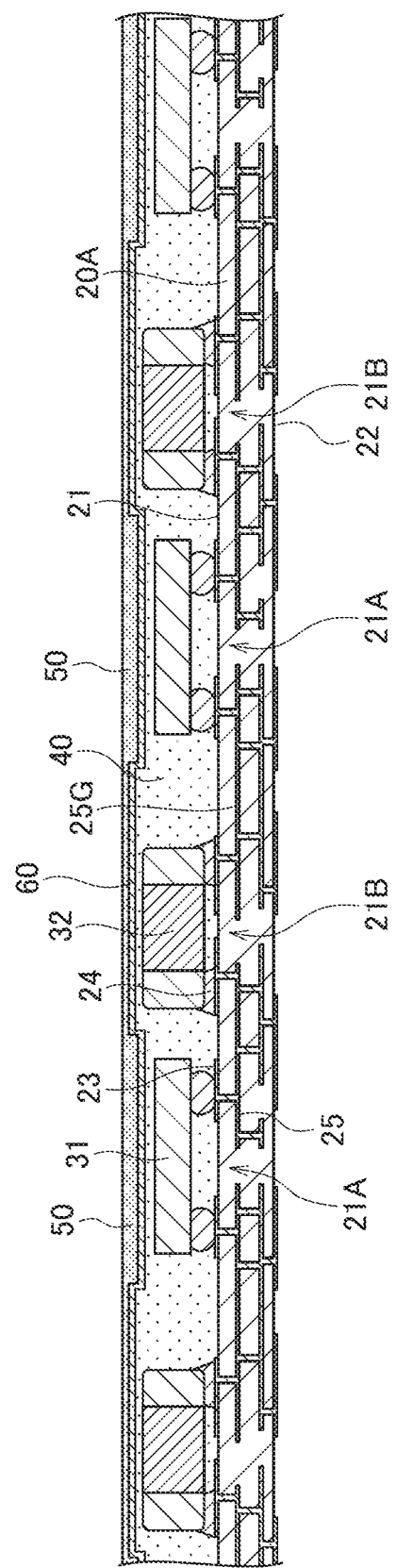
Figure 26:
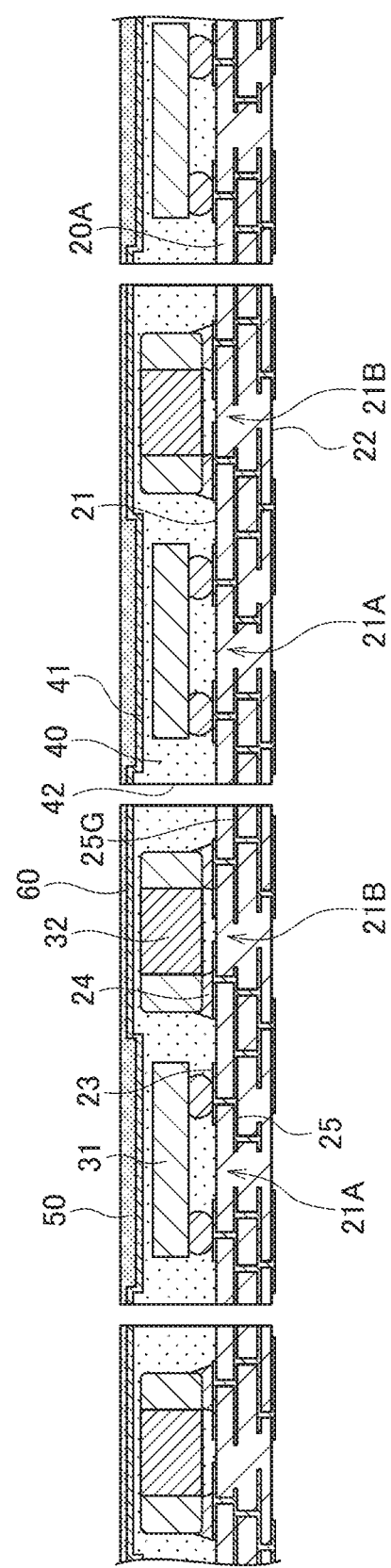

Then, as illustrated in FIG. 25, the magnetic film 50 is formed on the upper surface 41 of the mold resin 40 so as to fill the concave portion 47 and then, as illustrated in FIG. 26, the assembly substrate 20A is cut off along the dashed line a (see FIG. 2) to individuate the substrate 20. As a result, the power supply pattern 25G is exposed to the side surface 27 of the substrate 20.

Finally, the metal film 63 is formed so as to cover the upper surface 51 of the magnetic film 50, the side surface 42 of the mold resin 40 and side surface 27 of the substrate 20, whereby the electronic circuit package 13A according to the present embodiment is completed. In this manufacturing method, the metal films 60 and 63 are formed before and after formation of the magnetic film 50, so that the three-layer laminated film of the first metal film 60, magnetic film 50, and second metal film 63 can be obtained.

Figure 27:
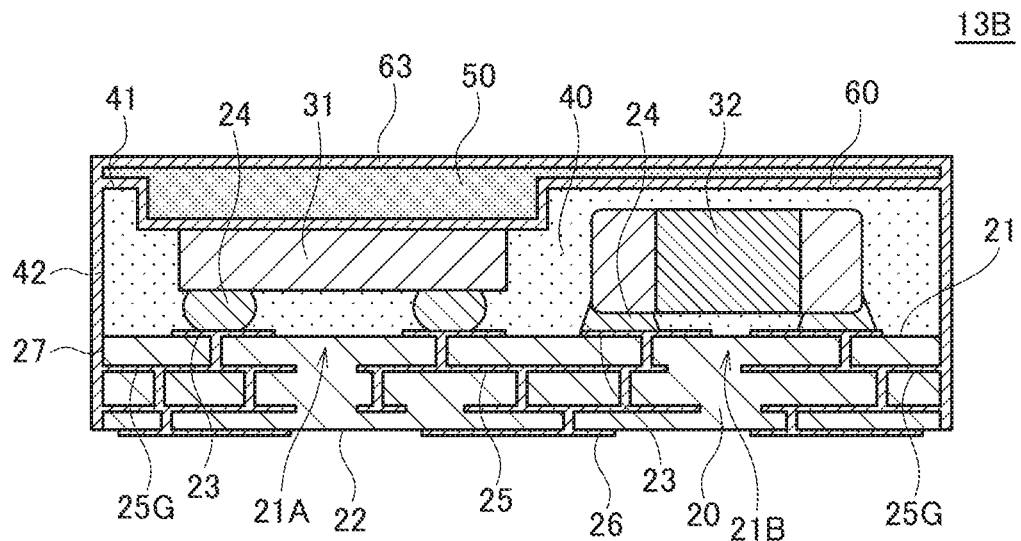
FIG. 27 is a cross-sectional view illustrating a configuration of an electronic circuit package 13B according to a first modification of the third embodiment.

FIG. 27 is a cross-sectional view illustrating a configuration of an electronic circuit package 13B according to a first modification of the third embodiment.

As illustrated in FIG. 27, the electronic circuit package 13B according to the first modification differs from the electronic circuit package 13A illustrated in FIG. 23 in that the upper surface of the electronic component 31 is exposed to the concave portion 47, allowing the metal film 60 to contact with the upper surface of the electronic component 31. Other configurations are the same as those of the electronic circuit package 13A illustrated in FIG. 23. Thus, the same reference numerals are given to the same elements, and overlapping description will be omitted.

According to the configuration illustrated in FIG. 27, the film thickness of the magnetic film 50 above the first region 21A can be made larger, whereby magnetic shielding characteristics can be enhanced. In addition, the upper surface of the electronic component 31 contacts the metal film 60 having a high thermal conductivity, so that high heat radiation efficiency can be obtained.

Figure 28:
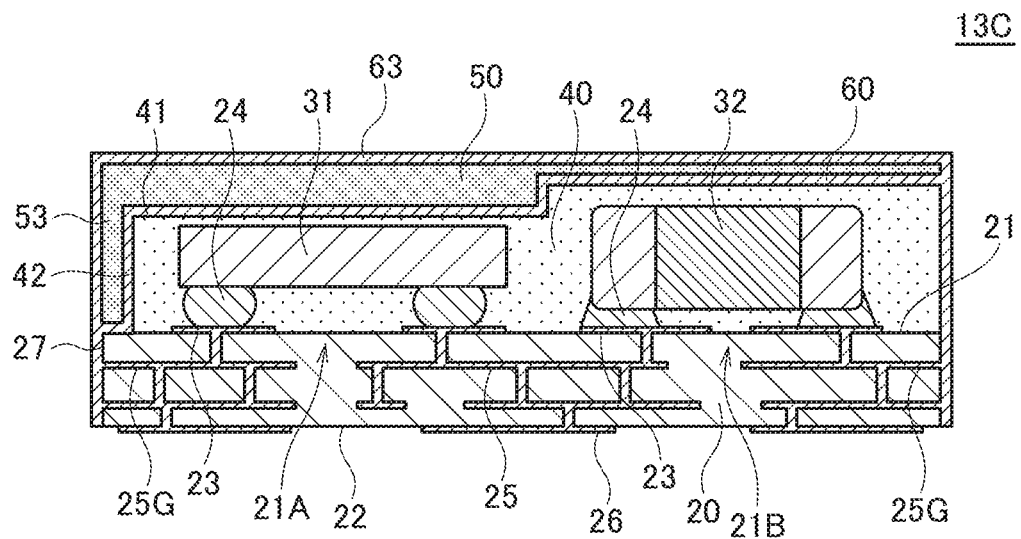
FIG. 28 is a cross-sectional view illustrating a configuration of an electronic circuit package 13C according to a second modification of the third embodiment.

FIG. 28 is a cross-sectional view illustrating a configuration of an electronic circuit package 13C according to a second modification of the third embodiment.

As illustrated in FIG. 28, the electronic circuit package 13C according to the second modification differs from the electronic circuit package 13A illustrated in FIG. 23 in that the side magnetic film 53 as a part of the magnetic film 50 covers a part of the side surface 42 of the mold resin 40. Other configurations are the same as those of the electronic circuit package 13A illustrated in FIG. 23. Thus, the same reference numerals are given to the same elements, and overlapping description will be omitted.

According to the configuration illustrated in FIG. 28, noise radiated from the electronic component 31 toward the side direction and noise to be incident on the electronic component 31 from the side direction can be attenuated. In this case also, the side magnetic film 53 may have a length equal to (see FIG. 14) or longer than (see FIG. 15) the concave portion 47 in a plan view. Further, when the electronic component 31 is disposed near a corner portion of the substrate 20, the side magnetic film 53 may be provided along two sides of the concave portion 47 in a plan view (see FIG. 16). Further, in this case, the lengths of the two sides of the side magnetic film 53 may be extended in a plan view (see FIG. 17).

While the preferred embodiments of the present invention have been described, the present invention is not limited thereto. Thus, various modifications may be made without departing from the gist of the invention, and all of the modifications thereof are included in the scope of the present invention.

EXAMPLES

<Production of Composite Magnetic Paste>

A composite magnetic paste was produced in the following way.

First, as an Fe-based spherical magnetic filler, AKT 4.5Si-5.0Cr (D50=30 µm) manufactured by Mitsubishi Steel Mfg. Co., Ltd. and carbonyl iron powder (D50=6 µm) manufactured by BASF Corporation were prepared. Then, AKT 4.5Si-5.0Cr and carbonyl iron powder were added to a thermosetting resin in a ratio of 8:2 at 90 wt. % in total. As for the thermosetting resin used, 830S (bisphenol A epoxy resin) made by Dainippon Ink & Chemicals, Inc. was used as a base resin, 0.5 equivalent of dicyandiamide made by Nippon Carbide Industries Co., Inc. was added to the base resin as a curing agent, and 1 wt. % of C11Z-CN (imidazole) made by Shikoku Chemicals Corporation was added to the base resin as a curing accelerator. Then, the above resin materials were blended together, followed by kneading and stirring by a vacuum defoaming stirring machine. After that, butylcarbitol acetate was added at appropriate timing so that the viscosity at 10 rpm is 50 Pa·S, followed by kneading and stirring again by the vacuum defoaming stirring machine, whereby a composite magnetic material paste was obtained.

<Physical Property Evaluation of Magnetic Film Sheet>

Then, a substrate for shield evaluation having a 50Ω resistor mounted thereon was prepared and was seal-molded by compression molding with G-770H manufactured by Sumitomo Bakelite Co., Ltd. used as a molding material. Thereafter, according to the method described in FIGS. 9 to 11, a concave portion having a 100 µm depth was formed in a 3 mm×3 mm area including a portion where the 50Ω resistor is mounted in a plan view. As a blasting process, wet blasting was performed.

Then, the above composite magnetic material paste was coated on an entire surface of the mold resin so as to fill the concave portion and then heat-cured at 180° C. for 60 minutes. Thereafter, a dicer was used to individuate the substrate to expose a ground pattern to the side surface of the substrate. Then, electroless plating was performed to form a metal film composed of a laminated film of Cu (film thickness of 1 µm) and Ni (film thickness of 2 µm) on the upper surface of the magnetic film, the upper surface and side surface of the mold resin, and the side surface of the substrate so as to contact the ground pattern, whereby a noise attenuation measurement sample A (working example) was obtained.

On the other hand, a noise attenuation measurement sample B (comparative example) was produced by a method similar to the production method for the noise attenuation measurement sample A; however, the magnetic film and metal film were not formed.

The noise attenuation measurement samples A and B were each connected to a signal generator, and a signal of an arbitrary frequency was transmitted to the 50Ω resistor, whereby the amount of noise radiated from each sample was measured by a neighboring magnetic field measuring apparatus. As a result, as compared to the noise attenuation measurement sample B, the noise attenuation measurement sample A exhibited attenuation effect of about 45 dBµV at 100 MHz and about 50 dBµV at 1.2 GHz. Further, in the noise attenuation measurement sample B, a well-defined peak was found around the 50Ω resistor as a noise generation source; on the other hand, in the noise attenuation measurement sample A, there was no peak, and noise was attenuated to substantially the same level over the entire surface. This indicates that not by increasing a thickness of the magnetic shield on the entire package, but by selectively increasing it on the noise generation source, the peak noise is eliminated to thereby provide sufficient shielding effect. Thus, effectiveness of the present invention was confirmed.

What is claimed is:

1. An electronic circuit package comprising:
   a substrate having a power supply pattern;
   a first electronic component mounted on a first region of a front surface of the substrate;
   a mold resin that covers the front surface of the substrate so as to embed the first electronic component therein; and
   a laminated film covering at least an upper surface of the mold resin, the upper surface of the mold resin having a concave portion on the first region, the laminated film including a magnetic film and a first metal film,
   wherein the first metal film is connected to the power supply pattern, and
   wherein a part of the magnetic film is formed in and fills the concave portion such that a thickness of the magnetic film in the concave portion is different from a thickness of the magnetic film away from the concave portion.

2. The electronic circuit package as claimed in claim 1, wherein the magnetic film is positioned between the first metal film and the mold resin.

3. The electronic circuit package as claimed in claim 1, wherein the first metal film is positioned between the mold resin and the magnetic film.

4. The electronic circuit package as claimed in claim 3, further comprising a second metal film that covers the magnetic film.

5. The electronic circuit package as claimed in claim 1, further comprising a second electronic component mounted on a second region of the front surface of the substrate, wherein the first electronic component is lower in height than the second electronic component.

6. The electronic circuit package as claimed in claim 1, wherein an upper surface of the first electronic component is exposed to the concave portion, thereby the upper surface of the first electronic component contacts the magnetic film or the first metal film.

7. The electronic circuit package as claimed in claim 1, wherein a planar size of the concave portion is larger than that of the first electronic component, thereby the concave portion overlaps an entire first electronic component in a plan view.

8. The electronic circuit package as claimed in claim 1, wherein the magnetic film has a portion that covers a part of a side surface of the mold resin.

9. The electronic circuit package as claimed in claim 1, wherein the power supply pattern is exposed to the front surface or a side surface of the substrate, and the first metal film contacts the power supply pattern exposed to the front surface or the side surface of the substrate.

10. The electronic circuit package as claimed in claim 1, wherein the magnetic film is a film formed of a composite magnetic material in which magnetic fillers are dispersed in a thermosetting resin material, or a thin film, a foil or a bulk sheet formed of a soft magnetic material or a ferrite.

11. The electronic circuit package as claimed in claim 1, wherein the metal film is mainly composed of at least one metal selected from a group consisting of Au, Ag, Cu, and Al, and a surface of the metal film is covered with an antioxidant film.

12. The electronic circuit package as claimed in claim 1, wherein the first electronic component is a semiconductor chip or a passive component.

13. An electronic circuit package comprising:
a substrate having a main surface, the main surface having a first region and a second region;
a semiconductor chip mounted on the first region;
a passive component mounted on the second region;
a mold resin that covers the main surface of the substrate so as to embed the semiconductor chip and the passive component therein; and
a laminated film covering at least an upper surface of the mold resin, the laminated film including a magnetic film and a first metal film,
wherein the first metal film is supplied with a fixed potential, and
wherein the magnetic film on the first region is thicker than the magnetic film on the second region.

14. The electronic circuit package as claimed in claim 13, wherein the main surface of the substrate further has another region different from the first and second regions, and
wherein the magnetic film on the first region is thicker than the magnetic film on the another region.

15. The electronic circuit package as claimed in claim 14, wherein a thickness of the magnetic film on the second region is a same as a thickness of the magnetic film on the another region.

16. The electronic circuit package as claimed in claim 13, wherein the upper surface of the mold resin has a concave portion on the first region.

* * * * *